(12) United States Patent
Kong et al.

(10) Patent No.: US 11,824,546 B2
(45) Date of Patent: Nov. 21, 2023

(54) APPARATUS AND METHOD FOR MINIMUM ENERGY TRACKING LOOP

(71) Applicant: Research & Business Foundation Sungkyunkwan University, Suwon-si (KR)

(72) Inventors: Bai Sun Kong, Suwon-si (KR); Jong Woo Kim, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 101 days.

(21) Appl. No.: 17/575,251

(22) Filed: Jan. 13, 2022

(65) Prior Publication Data

US 2022/0224341 A1 Jul. 14, 2022

(30) Foreign Application Priority Data

Jan. 13, 2021 (KR) .................. 10-2021-0004895

(51) Int. Cl.
*H03L 5/02* (2006.01)
*H02M 1/00* (2006.01)
(Continued)

(52) U.S. Cl.
CPC ............ *H03L 5/02* (2013.01); *G01R 21/1331* (2013.01); *H02M 1/0045* (2021.05); *H02M 3/157* (2013.01)

(58) Field of Classification Search
CPC ....... H02M 1/0045; H02M 3/157; H03L 5/02; G01R 21/1331
See application file for complete search history.

(56) References Cited

U.S. PATENT DOCUMENTS

| 2005/0168205 A1* | 8/2005 | Dwarakanath | H02M 3/157 |
| | | | 323/283 |
| 2021/0034086 A1* | 2/2021 | Rowley | H02M 3/07 |
| 2021/0203229 A1* | 7/2021 | Buhari | H02M 1/08 |

FOREIGN PATENT DOCUMENTS

WO    WO 2019/168528 A1    9/2019

OTHER PUBLICATIONS

Mo et al., "A Flexible Pulse Skip Modulation buck DC-DC converter enabling Minimum Energy Point Tracking," IEEE 11th International Conference on Solid-State and Integrated Circuit Technology, 2012, pp. 1-3.

(Continued)

*Primary Examiner* — Thienvu V Tran
*Assistant Examiner* — Johana Dumeng-Roman
(74) *Attorney, Agent, or Firm* — NSIP Law (57) ABSTRACT

Disclosed are an apparatuses and methods for minimum energy tracking loop that includes an oscillator to imitate a threshold path of a load system and automatically adjust a clock frequency as a supply voltage to the load system is changed, a voltage regulator configured to supply a power, an energy sensing unit which is connected to the oscillator and the voltage regulator and calculates a proportional energy proportional to a total energy consumed by the load system at a specific supply voltage, a minimum energy finder to find a minimum energy point of the load system by monitoring the calculated proportional energy proportional to the total energy at a plurality of supply voltages, a buck converter to supply a power to the load system with a supply voltage at which the load system operates with a minimum energy when the minimum energy point is found in the minimum energy finder.

20 Claims, 10 Drawing Sheets

(51) Int. Cl.
    *G01R 21/133*     (2006.01)
    *H02M 3/157*     (2006.01)

(56) References Cited

OTHER PUBLICATIONS

Ababei et al., "Distributed minimum energy point tracking for systems-on-chip," IEEE International Conference on Electro/Information Technology, 2014, pp. 246-251.

* cited by examiner

FIG. 12

APPARATUS AND METHOD FOR MINIMUM ENERGY TRACKING LOOP

CROSS-REFERENCE TO RELATED APPLICATIONS

This application claims the priority of Korean Patent Application No. 10-2021-0004895 filed on Jan. 13, 2021 in the Korean Intellectual Property Office, the disclosure of which is incorporated herein by reference.

BACKGROUND

Field

The present disclosure relates to an apparatus and a method for minimum energy tracking loop.

Description of the Related Art

Efficient energy calculation is recognized as one of the key issues to design battery-powered electronic devices. Specifically, ultra-low power devices such as implantable medical electronic devices need to operate with extremely low energy to maintain the activity for a remarkably long time. According to the voltage scaling, a switching energy of a digital CMOS circuit is quadratically decreased by scaling a supply voltage so that this is one of the most effective methods to achieve a goal. In the extreme case, a near/sub threshold CMOS allows a circuit to operate with a supply voltage which is similar to or lower than a threshold voltage of an MOS transistor to dramatically reduce the switching energy. However, unfortunately, the severe slowdown in the sub threshold CMOS circuit proportionally increases a time required to perform a given task and causes the leakage current to consistently flow therefor, which increases the leakage energy.

This opposite tendency of the switching energy and the leakage energy for scaling a supply voltage has led to the need to identify a minimum energy point (MEP) to achieve possible maximum power reduction, which is defined as a supply voltage. A total energy of the digital CMOS circuit can be minimized. This MEP is not fixed and may vary depending on a workload given to the circuit and a temperature at which the circuit operates.

In the related art, a minimum energy tracking loop using an embedded DC-DC converter has been proposed, but it has some limitations due to the fact that a supply voltage of a load system is intentionally changed to measure a total energy consumed by the load system. First, an energy amount measured by the loop inevitably has an error proportional to an amount of changed supply voltage. For example, when the load system consumes a lot of energy so that the change in the supply voltage during a sensing period is increased, the error of the measured energy is correspondingly increased, which causes a deviation from an actual MEP. Second, an energy of the load system cannot be accurately measured due to the limitation of the circuit components. For example, when the load system consumes a very small energy so that a change in the supply voltage is negligible (1 mV or lower) during the sensing, the error due to the offset of a comparator which senses the change in the supply voltage becomes dominant, which prevents the accurate measurement of a total consumed energy. As a third limitation, a tracking voltage step of the loop of the related art is limited to 50 mV or higher. When the voltage step is set too small, the existing loop may be stabilized at an energy point which is not minimum, due to the error. However, today, a supply voltage of a smart phone and a smart pad needs to be finely controlled in a step of 10 mV or lower to find an operating energy level which is close to an actual minimum energy as much as possible. A voltage difference of 50 mV may cause a large error in a measured minimum energy according to an application or a characteristic of the CMOS process.

As described above, the minimum energy tracking loop of the related art has the following disadvantages. First, an energy amount measured by the minimum energy tracking loop has an error proportional to an amount of changed supply voltage. Further, the fact that the energy value of the load system cannot be accurately measured is also pointed out as a major disadvantage.

SUMMARY

An object of exemplary embodiments of the present disclosure is to provide an apparatus and a method for a minimum energy tracking loop to provide a tracking loop of a minimum energy point having accurate energy sensing and hierarchical tracking characteristics.

However, the problems to be solved by the present disclosure are not limited thereto and may be variously expanded in an environment without departing from the spirit and the scope of the present disclosure.

According to an aspect of the present disclosure, a minimum energy tracking loop apparatus connected to a load system includes an oscillator configured to imitate a threshold path of the load system and automatically adjust a clock frequency as a supply voltage to the load system is changed; a voltage regulator configured to supply a power to the load system so as to maintain a constant output during each process of sensing an energy of the load system; an energy sensing unit which is connected to the oscillator and the voltage regulator and calculates a proportional energy proportional to a total energy consumed by the load system at a specific supply voltage; a minimum energy finder configured to find a minimum energy point of the load system by monitoring the calculated proportional energy proportional to the total energy at a plurality of supply voltages; a buck converter configured to supply a power to the load system with a supply voltage at which the load system operates with a minimum energy when the minimum energy point is found in the minimum energy finder; and a digital-analog converter which is connected to the voltage regulator and the buck converter and converts the found minimum energy point into an analog reference voltage to provide the converted energy point to the voltage regulator and the buck converter.

The energy sensing unit may include: a ring oscillator which uses a bias current scaled from an output current of the voltage regulator to charge and discharge an internal node and is toggled according to an operation frequency proportional to the bias current during an energy sensing period; a frequency-digital converter which counts the number of toggles of the ring oscillator to convert the number of toggles into a digital value; and a multiplier which multiplies the converted digital value and a supply voltage which is supplied to the load system to calculate a proportional energy proportional to a total energy consumed by the load system.

The operation frequency may be proportional to an output current of the voltage regulator.

The minimum energy finder may find a minimum energy point of the load system using a coarse tracking loop using a first step voltage and a fine tracking loop using a second step voltage which is lower than the first step voltage.

The minimum energy finder may perform the coarse tracking loop operation which calculates a first proportional energy using the initialized reference voltage and compares a second proportional energy calculated by increasing or decreasing the initialized reference voltage with the calculated first proportional energy.

The minimum energy finder may calculate the second proportional energy by increasing or decreasing the initialized reference voltage by a first step voltage.

The minimum energy finder may perform the coarse tracking loop operation to confirm whether the calculated second proportional energy exceeds the calculated first proportional energy.

The minimum energy finder may perform a fine tracking loop operation which compares a third proportional energy calculated by increasing or decreasing the calculated reference voltage with the calculated first proportional energy.

The minimum energy finder may calculate the third proportional energy by increasing or decreasing the calculated reference voltage by a second step voltage.

The minimum energy finder may perform the fine tracking loop operation to confirm whether the calculated third proportional energy exceeds the calculated first proportional energy.

According to another aspect of the present disclosure, a minimum energy tracking loop method performed by a minimum energy tracking loop apparatus connected to a load system includes imitating a threshold path of a load system and automatically adjusting a clock frequency as a supply voltage to the load system is changed; supplying a power to the load system so as to maintain a constant output during each process of sensing an energy of the load system, calculating a proportional energy which is proportional to a total energy consumed by the load system at a specific supply voltage, finding a minimum energy point of the load system by monitoring the calculated proportional energy proportional to the total energy at a plurality of supply voltages, supplying a power to the load system with a supply voltage at which the load system operates with a minimum energy when the minimum energy point is found; and converting and providing the found minimum energy point into an analog reference voltage.

The calculating of a proportional energy may include: using a bias current scaled from a voltage regulated output current to charge and discharge an internal node and toggling according to an operation frequency proportional to the bias current during an energy sensing period; counting the number of toggles to convert the number of toggles into a digital value; and multiplying the converted digital value and a supply voltage which is supplied to the load system to calculate a proportional energy proportional to a total energy consumed by the load system.

The operation frequency may be proportional to the output current.

In the finding of a minimum energy point, a minimum energy point of the load system may be found using a coarse tracking loop using a first step voltage and a fine tracking loop using a second step voltage which is lower than the first step voltage.

In the finding of a minimum energy point, the coarse tracking loop operation which calculates a first proportional energy using the initialized reference voltage and compares a second proportional energy calculated by increasing or decreasing the initialized reference voltage with the calculated first proportional energy may be performed.

In the finding of a minimum energy point, the second proportional energy may be calculated by increasing or decreasing the initialized reference voltage by a first step voltage.

In the finding of a minimum energy point, the coarse tracking loop operation to confirm whether the calculated second proportional energy exceeds the calculated first proportional energy may be performed.

In the finding of a minimum energy point, a fine tracking loop operation which compares a third proportional energy calculated by increasing or decreasing the calculated reference voltage with the calculated first proportional energy may be performed.

In the finding of a minimum energy point, the third proportional energy may be calculated by increasing or decreasing the calculated reference voltage by a second step voltage.

In the finding of a minimum energy point, the fine tracking loop operation to confirm whether the calculated third proportional energy exceeds the calculated first proportional energy may be performed.

According to another aspect of the present disclosure, provided is a non-transitory computer readable storage medium which stores instructions which are executed by a processor to allow the processor to perform the method including: imitating a threshold path of a load system and automatically adjusting a clock frequency as a supply voltage to the load system is changed, supplying a power to the load system so as to maintain a constant output during each process of sensing an energy of the load system, calculating a proportional energy which is proportional to a total energy consumed by the load system at a specific supply voltage, finding a minimum energy point of the load system by monitoring the calculated proportional energy proportional to the total energy at a plurality of supply voltages, supplying a power to the load system with a supply voltage at which the load system operates with a minimum energy when the minimum energy point is found; and converting and providing the found minimum energy point into an analog reference voltage.

The present disclosure has the following effects. However, it does not mean that a specific embodiment should include all the following effects or only the following effects so that it may be understood that the scope of the disclosed technology is not limited thereby.

The exemplary embodiment of the present disclosure solves the problem in that a measured energy value of the load system is proportional to a change in the supply voltage and this measured value solves an error to play a big role for a low-power design of various mobile devices such as notebooks and cellular phones.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Those skilled in the art may make various modifications to the present disclosure and the present disclosure may have various embodiments thereof, and thus specific embodiments will be illustrated in the drawings and described in detail in detailed description. However, this does not limit the present disclosure within specific exemplary embodiments, and it should be understood that the present disclosure covers all the modifications, equivalents and replacements within the spirit and technical scope of the present disclosure. In describing the present disclosure, when it is determined that a detailed description of related well-known technology may obscure the gist of the present disclosure, the detailed description thereof will be omitted.

Terms such as first or second may be used to describe various components but the components are not limited by the above terms. The above terms are used only to discriminate one component from the other component.

Terms used in the following description are used to describe a specific exemplary embodiment but are not intended to limit the present disclosure. Terminologies used in the specification are selected from general terminologies which are currently and widely used as much as possible while considering a function in the present disclosure, but the terminologies may vary in accordance with the intention of those skilled in the art, custom, or appearance of new technology. Further, in particular cases, the terminologies are arbitrarily selected by an applicant and in this case, the meaning thereof may be described in a corresponding section of the description of the disclosure. Therefore, the terminology used in the specification is analyzed based on a substantial meaning of the terminology and the specification rather than a simple title of the terminology.

A singular form may include a plural form if there is no clearly opposite meaning in the context. In the present application, it should be understood that term "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

Hereinafter, exemplary embodiments according to the present disclosure will be described in detail with reference to the accompanying drawings, and the same or corresponding constituent elements are denoted by the same reference numerals regardless of a sign of the drawing, and repeated description thereof will be omitted.

Figure 1:
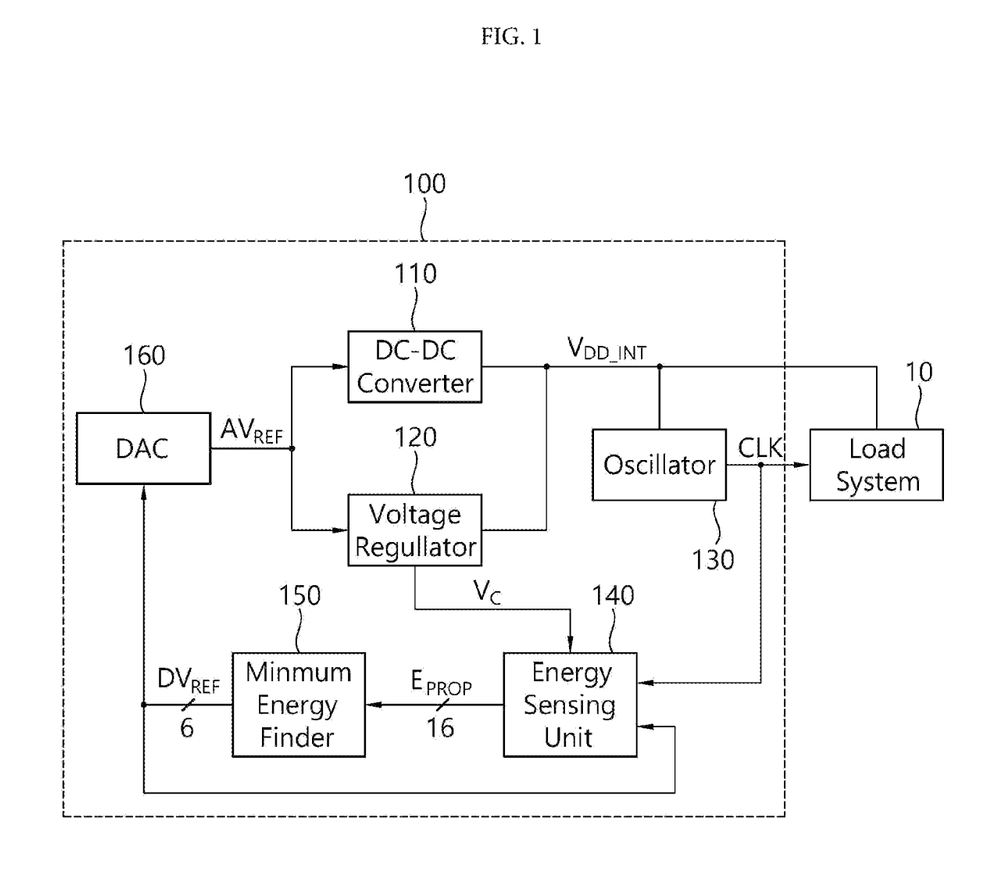
FIG. 1 is a block diagram of a minimum energy tracking loop apparatus according to an exemplary embodiment of the present disclosure.

FIG. 1 is a block diagram of a minimum energy tracking loop apparatus according to an exemplary embodiment of the present disclosure.

As illustrated in FIG. 1, a minimum energy trading loop apparatus according to an exemplary embodiment of the present disclosure includes a buck converter 110, a voltage regulator 120, an oscillator 130, an energy sensing unit 140, a minimum energy finder 150, and a digital-analog converter 160.

However, not all the illustrated components are essential components. The minimum energy tracking loop apparatus 100 may be implemented with components more than the illustrated components or may also be implemented with less components.

Hereinafter, specific configurations and operations of components of the minimum energy tracking loop apparatus 100 of FIG. 1 will be described.

First, the minimum energy tracking loop apparatus 100 according to the exemplary embodiment of the present disclosure is connected to a load system 10.

The energy sensing unit 140 is connected to the oscillator 130 and the voltage regulator 120 and calculates a proportional energy $E_{PROP}$ proportional to a total energy consumed by the load system 10 at a specific supply voltage.

The minimum energy finder 150 finds a minimum energy point of the load system 10 by monitoring a value of the proportional energy $E_{PROP}$ at various supply voltages and outputs the result as a six-bit digital value $DV_{REF}$.

The digital-analog converter 160 is connected to the voltage regulator 120 and the buck converter 110 and converts a digital reference voltage $DV_{REF}$ corresponding to a found minimum energy point into an analog reference voltage $AV_{REF}$ to output the converted value to the buck converter 110 or the voltage regulator 120. The analog reference voltage is used as a reference voltage for the buck converter 110 or the voltage regulator 120.

During an entire energy sensing period in which the energy sensing unit 140 measures an amount of energy consumed at various supply voltages, the load system is supplied with a power by the voltage regulator 120 in which an output is consistently maintained at each step of the energy sensing period. The voltage regulator 120 supplies the power to the load system 10 to maintain a constant output at each process for energy sensing of the load system 10. During this energy sensing period, the buck converter 110 is turned off.

When the minimum energy point is found by the minimum energy finer 150, the buck converter 110 supplies a power to the load system at a supply voltage at which the load system 10 operates with a minimum energy.

The oscillator 130 imitates a threshold path of the load system 10 and automatically adjusts a clock frequency as the supply voltage for the load system 10 is changed.

Figure 2:
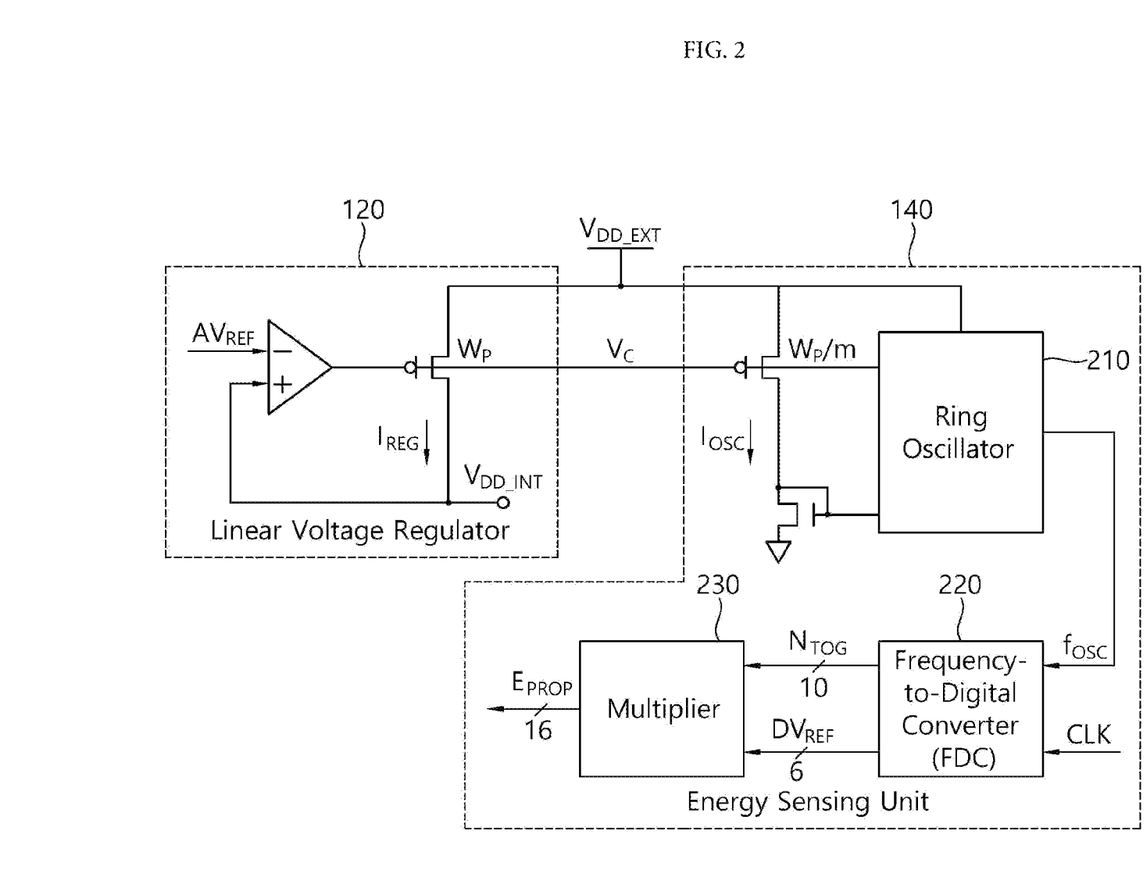
FIG. 2 is a block diagram of an energy sensing unit according to an exemplary embodiment of the present disclosure.

FIG. 2 is a block diagram of an energy sensing unit according to an exemplary embodiment of the present disclosure.

FIG. 2 shows a block diagram of an energy sensing unit 140. The energy sensing unit 140 includes a ring oscillator 210, a frequency-to-digital converter 220, and a multiplier 230.

A bias voltage $I_{OSC}$ scaled from an output current $I_{REG}$ of the voltage regulator 120 is supplied to the ring oscillator 210 used to charge and discharge an internal node of the ring oscillator 210. Therefore, an operation frequency is represented by the following Equation 1.

$$f_{OSC} = \frac{I_{OSC}}{N_{OSC}C_{OUT}V_{DD\_EXT}} = \frac{I_{REG}}{mN_{OSC}V_{DD\_EXT}} \quad \text{[Equation 1]}$$

Here, $N_{OSC}$ is the number of stages, $C_{OUT}$ is an output capacitance of each oscillator stage, and $V_{DD\_EXT}$ is a supply voltage. The constant m is a scaling factor to obtain $I_{OSC}$ from $I_{REG}$.

As seen from Equation 1, $f_{OSC}$ is proportional to $I_{OSC}$, so that it is proportional to $I_{REG}$. During the energy sensing period, $I_{PEG}$ continuously changes according to a given workload so that $f_{OSC}$ proportionally continuously changes. In the load system 10, the power is supplied by the voltage regulator 120 during the energy sensing period so that a total quantity of electric charges $Q_{TOT}$ consumed by the load system 10 may be obtained by combining $I_{REG}$ during the entire energy sensing period TES and may be represented by the following Equation 2.

$$Q_{TOT} = \int_0^{TES} I_{REG} dt = mN_{OSC}C_{OUT}V_{DD\_EXT} \times \int_0^{TES} f_{OSC} dt \quad \text{[Equation 2]}$$

When both sides are integrated by defining an average quantity, the following Equation 3 I obtained.

$$Q_{TOT} = I_{REG,AVG} \times T_{ES} \quad \text{[Equation 3]}$$
$$= mN_{OSC}C_{OUT}V_{DD\_EXT} \times f_{OSC,AVG} \times T_{ES}$$

Here, $T_{REG,AVG}$ is an average current and $f_{OSC,AVG}$ is an average frequency for $T_{ES}$.

A product of $f_{OSC,AVG}$ and $T_{ES}$ of Equation 3 is equal to the number of toggles $N_{TOG}$ in the output of the ring oscillator 210 during $T_{ES}$, so that during the energy sensing period, a total charge consumed in the load system 10 is the same as represented by the following Equation 4.

$$Q_{TOT} mN_{OSC}C_{OUT}V_{DD\_EXT} \times N_{TOG} \quad \text{[Equation 4]}$$

This result indicates that the number of toggles of the ring oscillator is counted to find out a total charge consumed by the load system 10 during the energy sensing period. In order to utilize this result, the frequency-to-digital converter of the energy sensing unit 140 converts a toggle count of the ring oscillator into a digital value $N_{TOG}$ as illustrated in FIG. 2. $N_{TOG}$ is set by 10 bits to process a wide range of workload. As seen from Equation 4, when $N_{TOG}$ (proportional to $Q_{TOT}$) is multiplied with $DV_{REF}$ (a digital corresponding to $V_{DD\_INT}$), a value proportional to a total energy consumed by the load system 10 is generated. To be more specific, $E_{PROP}$ (=$N_{TOG} \cdot DV_{REF}$) calculated by the multiplier 230 of the energy sensing unit 140 is 16 bit digital data which is proportional to an energy consumed by the load system 10 at a given load supply voltage.

As described above, the minimum energy tracking loop has a problem in that there may be an error in the measured energy due to the change in the load supply voltage during the energy sensing period. In contrast, the energy sensing unit 140 according to the exemplary embodiment of the present disclosure completely removes the error by supplying stable voltage and current to the load system 10 by means of the voltage regulator in each step of the energy sensing periods. Another problem of the energy sensing unit 140 is an error due to an offset of the comparator which senses a supply voltage change of the load system 10 when the variation is very small. That is, if the load system 10 consumes a very small energy, the supply voltage change is negligible, so that the error of the existing energy sensing circuit is increased due to the offset of the comparator.

The energy sensing unit 140 according to the exemplary embodiment of the present disclosure uses a current starved ring oscillator 210 having an operation frequency which is accurately proportional to an amount of current consumed by the load system 10 to maintain the error of the energy sensing unit 140 to be small. Accordingly, the minimum energy tracking loop apparatus 100 according to the exemplary embodiment of the present disclosure may more accurately measure the energy consumption than the related art.

Figure 3:
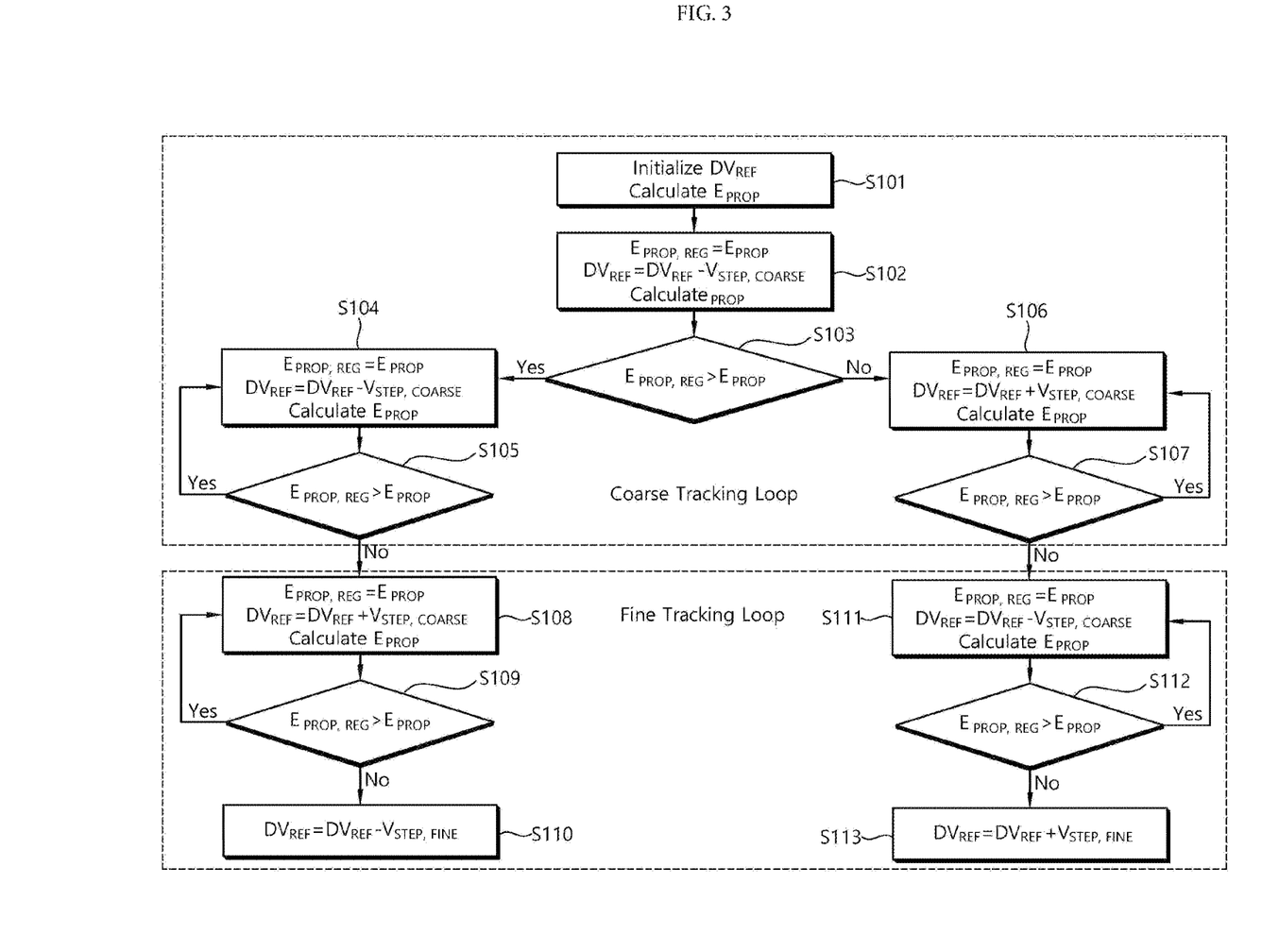
FIG. 3 is a flowchart for a minimum energy tracking method for a minimum energy tracking loop operation according to an exemplary embodiment of the present disclosure.

FIG. 3 is a flowchart for a minimum energy tracking method for a minimum energy tracking loop operation according to an exemplary embodiment of the present disclosure.

As illustrated in FIG. 3, the minimum energy tracking method according to the exemplary embodiment of the present disclosure operates to quickly and accurately track the minimum energy by a fine tracking loop operation including steps S108 to S113 after a coarse tracking loop operation including steps S101 to S107. The minimum energy tracking apparatus finds a minimum energy point of the load system 10 using a coarse tracking loop using a first step voltage and a fine tracking loop using a second step voltage which is lower than the first step voltage.

After acquiring a proportional energy $E_{PROP}$ which is an amount proportional to a total energy consumed by the load system 10 by the energy sensing unit 140, the minimum energy finder 150 of FIG. 1 identifies the minimum energy point using the minimum energy tracking method. The minimum energy point tracking method according to the exemplary embodiment of the present disclosure is illustrated in FIG. 3 having two tracking loops, that is, a coarse tracking loop and a fine tracking loop.

The minimum energy tracking loop apparatus 100 calculates $E_{PROP}$ with an initial $DV_{REF}$ stored in a register $E_{PROP,REG}$ as a coarse tracking loop in step S101.

After $DV_{REF}$ is reduced by a coarse step voltage (first step voltage) $V_{STEP,COARSE}$ (50 mV) in step S102, the minimum energy tracking loop apparatus 100 recalculates $E_{PROP}$ to compare with a value stored in $E_{PROP,REG}$ in step S103.

When current $E_{PROP}$ is lower than $E_{PROP,REG}$, the minimum energy tracking loop apparatus 100 reduces $DV_{REF}$ by the same coarse step voltage in step S104 and updates $E_{PROP,REG}$ until new $E_{PROP}$ is equal to or higher than a value stored in $E_{PROP,REG}$ in step S105.

When current $E_{PROP}$ is equal to or lower than $E_{PROP,REG}$, the minimum energy tracking loop apparatus 100 increases $DV_{REF}$ by the same coarse step voltage in step S106 and updates $E_{PROP,REG}$ until new $E_{PROP}$ is equal to or higher than a value stored in $E_{PROP,REG}$ in step S107.

As described above, the minimum energy finder 150 performs the coarse tracking loop operation which calculates a first proportional energy using the initialized reference voltage and compares a second proportional energy calculated by increasing or decreasing the initialized reference voltage with the calculated first proportional energy. The minimum energy finder 150 calculates the second proportional energy by increasing or decreasing the initialized reference voltage by a first step voltage. The minimum energy finder 150 performs the coarse tracking loop operation to confirm whether the calculated second proportional energy exceeds the calculated first proportional energy.

Next, the fine tracking loop will be described.

When the new $E_{PROP}$ is equal to or higher than the value stored in $E_{PROP,REG}$ in step S105, the minimum energy tracking loop apparatus 100 ends the coarse tracking loop and starts the fine tracking loop in an opposite tracking direction. As long as the current $E_{PROP}$ is lower than previous $E_{PROP}$, the fine tracking loop increases $DV_{REF}$ by one fine step voltage $V_{STEP,FINE}$ (10 mV) to update $E_{PROP,REG}$ in step S108.

When the minimum energy tracking loop apparatus 100 initially finds new $E_{PROP}$ which is equal to or higher than previous $E_{PROP}$ in step S109, the minimum energy tracking loop apparatus returns (decreases) $DV_{REF}$ to the fine step voltage (a second step voltage) by one step to reach the minimum energy point and then ends the fine tracking loop in step S110.

When the new $E_{PROP}$ is equal to or higher than the value stored in $E_{PROP,REG}$ in step S107, the minimum energy tracking loop apparatus 100 ends the coarse tracking loop and starts the fine tracking loop in an opposite tracking direction. As long as the current $E_{PROP}$ is lower than previous $E_{PROP}$, the fine tracking loop decreases $DV_{REF}$ by one fine step voltage $V_{STEP,FINE}$ (10 mV) to update $E_{PROP,REG}$ in step S111.

When the minimum energy tracking loop apparatus 100 initially finds new $E_{PROP}$ which is equal to or higher than previous $E_{PROP}$ in step S112, the minimum energy tracking loop apparatus returns (increases) $DV_{REF}$ to the fine step voltage (a second step voltage) by one step to reach the minimum energy point and then ends the fine tracking loop in step S113.

As described above, the minimum energy finder 150 performs a fine tracking loop operation which compares a third proportional energy calculated by increasing or decreasing the calculated reference voltage with the calculated first proportional energy. The minimum energy finder 150 calculates the third proportional energy by increasing or decreasing the calculated reference voltage by the second step voltage. The minimum energy finder 150 performs the fine tracking loop operation to confirm whether the calculated third proportional energy exceeds the calculated first proportional energy.

The minimum energy tracking loop method according to the exemplary embodiment of the present disclosure allows the load system 10 to access in the vicinity of the minimum energy point by the coarse tracking loop and finds an accurate minimum energy point by the fine tracking loop. For example, since the coarse step voltage is almost 50 mV, the tracking loop according to the exemplary embodiment of the present disclosure has an advantage of fast access to the vicinity of the minimum energy point. Since the fine step voltage is as small as 10 mV, the minimum energy tracking loop method has another advantage of accurately finding the actual minimum energy point. A good tracking accuracy is achieved by the fine tracking loop and a desirable entire tracking speed is achieved by the coarse tracking loop.

Figure 4:
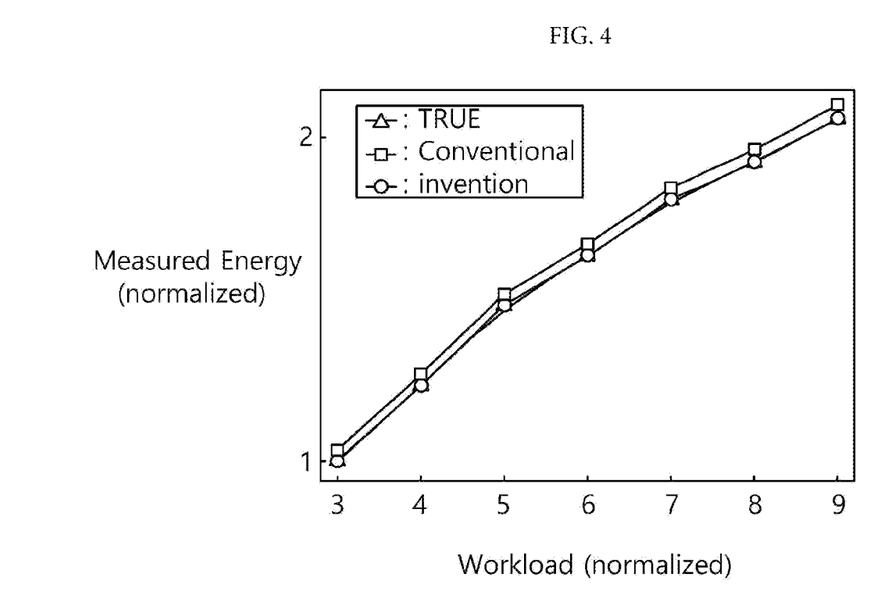
FIGS. 4 and 5 are views illustrating an energy amount measured in a light workload and a heavy workload according to an exemplary embodiment of the present disclosure and the related art.
Figure 5:
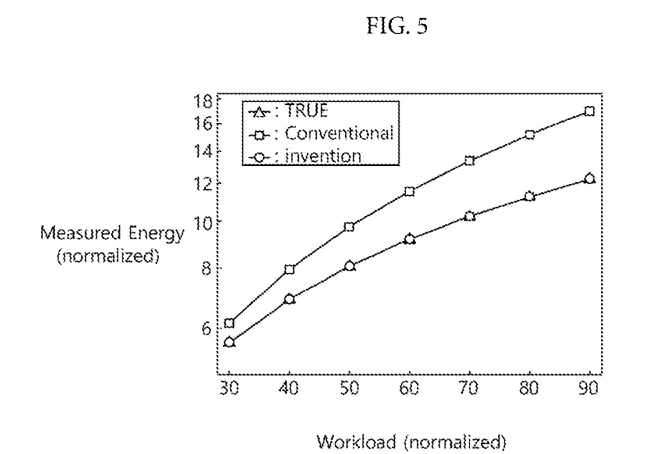

FIGS. 4 and 5 are views illustrating an energy amount measured in a light workload and a heavy workload according to an exemplary embodiment of the present disclosure and the related art.

FIGS. 4 and 5 show an energy amount measured in a light workload and a heavy workload and it may be understood that an energy amount measured by the exemplary embodiment of the present disclosure is very closer to an actual energy amount than the energy amount measured by the related art method. In FIGS. 4 and 5, the minimum energy in the worst case normalized by the tracking loops is compared with the light workload and the heavy workload, respectively. In FIGS. 4 and 5, TRUE indicates an actual minimum energy curve as a reference for comparing the accuracy of the minimum energy obtained in each loop. As seen from FIGS. 4 and 5, the minimum energy amount measured by the exemplary embodiment of the present disclosure is very close and almost equal to the actual minimum energy level in the light workload and the heavy workload, respectively, as compared with the related art.

Figure 6:
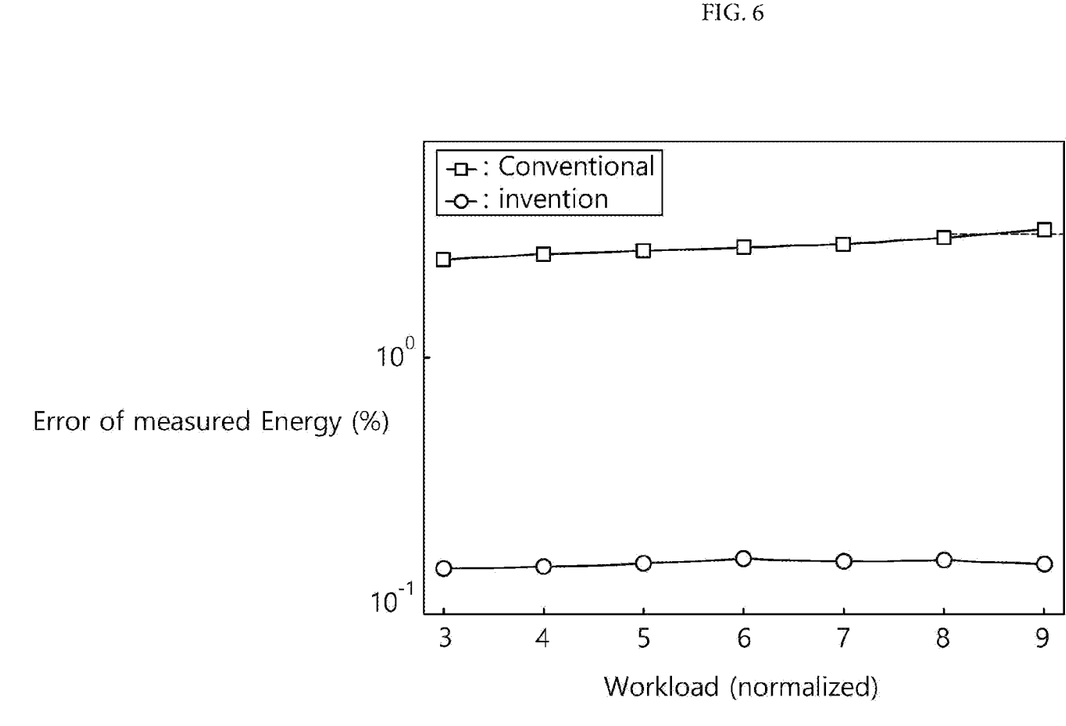
FIGS. 6 and 7 are views a percentage error of a minimum energy measured in a light workload and a heavy workload according to an exemplary embodiment of the present disclosure.
Figure 7:
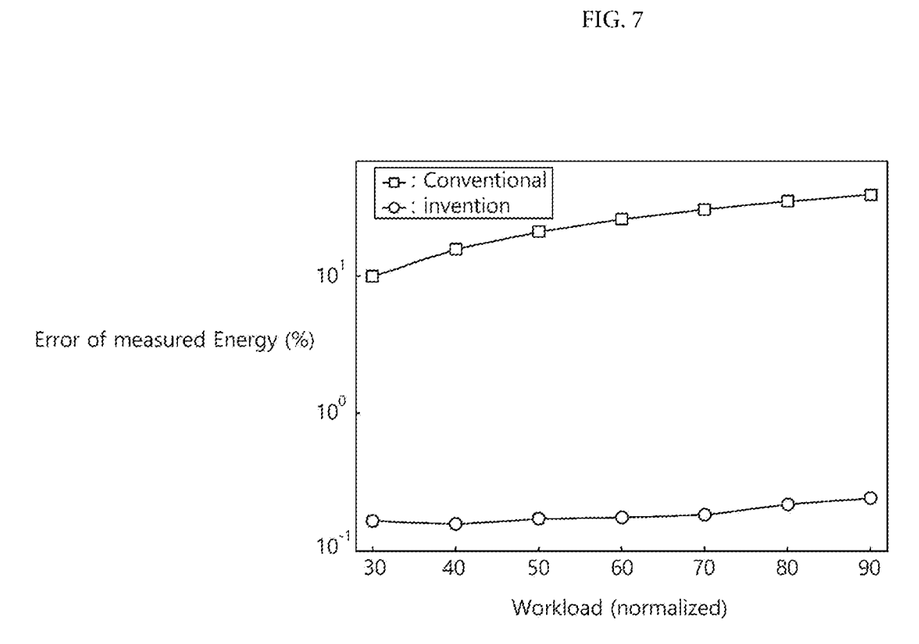

FIGS. 6 and 7 are views a percentage error of a minimum energy measured in a light workload and a heavy workload according to an exemplary embodiment of the present disclosure.

In FIGS. 6 and 7, percentage errors between an actual minimum energy and a minimum energy measured by each loop are compared. The error of the minimum energy measured by the conventional loop is 3.1% at maximum for a light workload (3 to 9 times unit load) and 38.9% at maximum for a heavy workload (30 to 90 times unit load).

In the meantime, the error of the minimum energy measured by the exemplary embodiment of the present disclosure is 0.16% for a light workload (3 to 9 times unit workload) and just 0.24% for a heavy workload (30 to 90 times unit workload). As a result, the accuracy is improved to 95.0% and 99.4% as compared with the tracking loop according to the related art. As a result of evaluation, it may be understood that the tracking loop according to the exemplary embodiment of the present disclosure is capable of very accurately identifying an actual minimum energy level.

Figure 8:
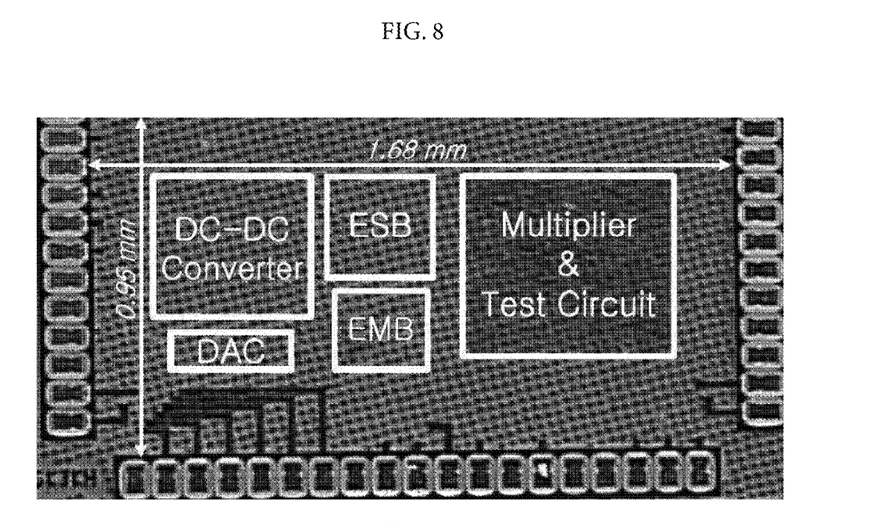
FIG. 8 is a view illustrating a silicon test chip photograph for a minimum energy tracking loop hardware according to an exemplary embodiment of the present disclosure.

FIG. 8 is a view illustrating a silicon test chip photograph for a minimum energy tracking loop hardware according to an exemplary embodiment of the present disclosure.

FIG. 8 shows a silicon test chip photograph for a minimum energy tracking loop hardware according to an exemplary embodiment of the present disclosure. In order to evaluate an actual applicability, an MET loop proposed to have a variable word length multiplier was manufactured as the load system 10. The variable word length multiplier has two operations modes of 16×16 and 32×32. In the 16×16 mode, a lower 16 bit multiplier and a multiplier are used and unused input and a partial product block forcibly become 0. In the 32×32 mode, all inputs and partial product blocks are used. The multiplier uses a modified booth algorithm and a Wallace tree structure and may operate to a supply voltage of 250 mV. FIG. 8 shows a die photograph of a test chip including an MET hardware and a load system 10 which occupies 1.43×0.64 mm². The MET loop circuit excluding the multiplier occupies 0.66×0.64 mm².

Figure 9:
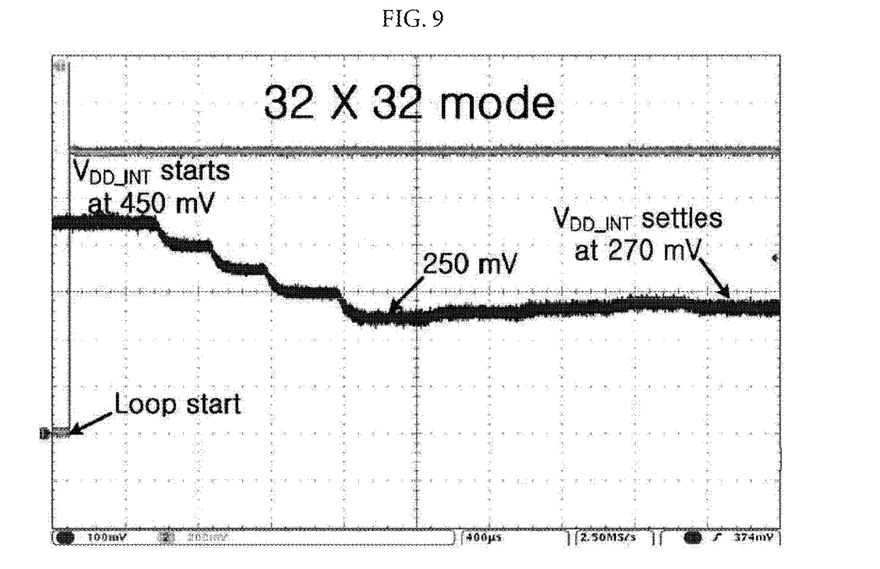
FIGS. 9 and 10 are views illustrating a supply voltage changing progress at a minimum energy point which is actually measured in a 32×32 mode and a 16×16 mode according to an exemplary embodiment of the present disclosure.
Figure 10:
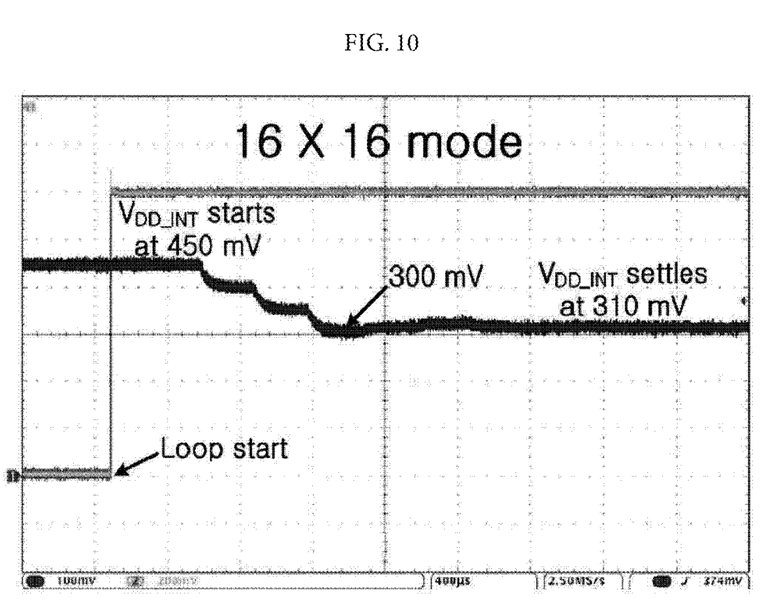

FIGS. 9 and 10 are views illustrating a supply voltage changing progress at a minimum energy point which is actually measured in a 32×32 mode and a 16×16 mode according to an exemplary embodiment of the present disclosure.

In FIGS. 9 and 10, a measured waveform of the MET loop proposed in various workloads, for example, a 32×32 mode and a 16×16 mode. FIGS. 9 and 10 show a measured waveform of the proposed MET hardware having a load system 10 which operates in each operation mode. FIG. 9 illustrates the 32×32 operation mode and FIG. 10 illustrates the 16×16 operation mode. In FIG. 9, it is understood that the coarse tracking loop starts from $V_{DD\_INT}$ at 450 mV and lowers $V_{DD\_INT}$ (=$DV_{REF}$) by a voltage step of approximately 50 mV to find the minimum energy point.

It is recognized that new $E_{PROP}$ becomes higher than previous $E_{PROP}$ at 250 mV and the coarse tracking loop is switched to the fine tracking loop which starts by increasing $V_{DD\_INT}$ to a fine voltage step of approximately 10 mV. As soon as the fine tracking loop finds that new $E_{PROP}$ becomes larger than previous $E_{PROP}$ at 280 mV, the minimum energy tracking loop recognizes that the minimum energy point of the multiplier generates at 270 mV. As illustrated in FIG. 10, the energy tracking loop finds that the minimum energy point of the multiplier which operates in the 16×16 mode is generated at 310 mV by a similar procedure.

Figure 11:
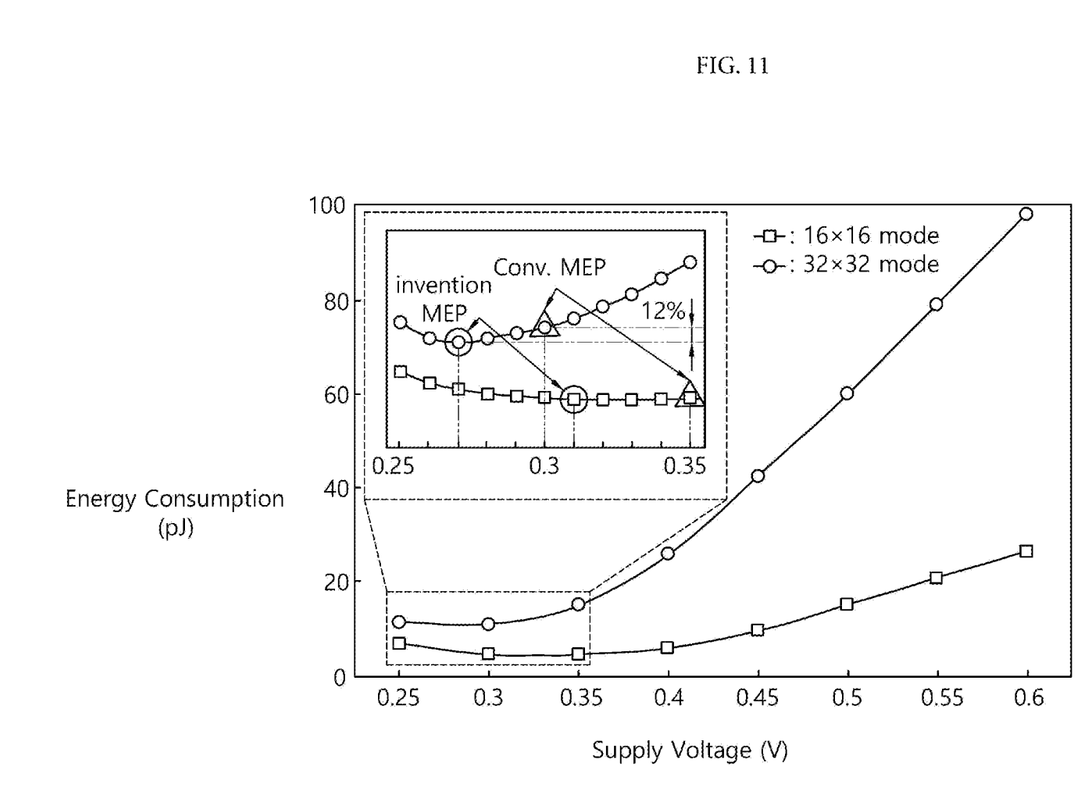
FIGS. 11 and 12 are views illustrating a measured energy of a variable word length multiplier according to a change in a supply voltage according to an exemplary embodiment of the present disclosure.
Figure 12:
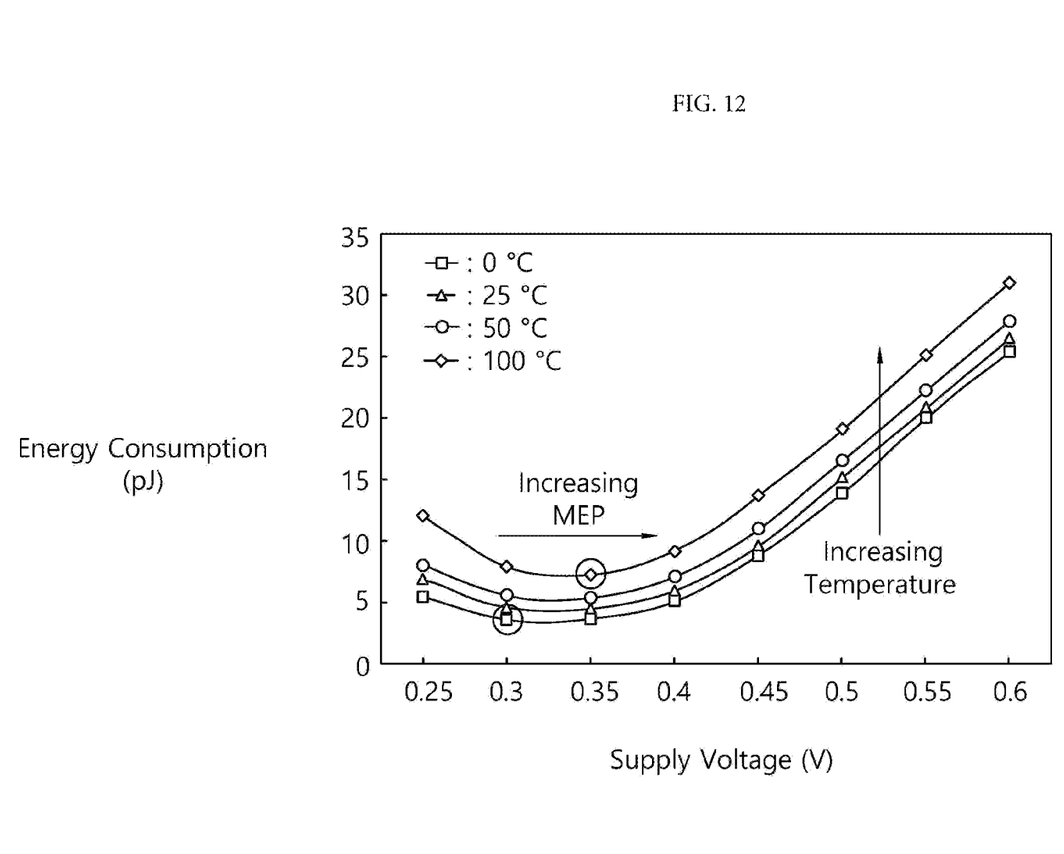

FIGS. 11 and 12 are views illustrating a measured energy of a variable word length multiplier according to a change in a supply voltage according to an exemplary embodiment of the present disclosure.

FIGS. 11 and 12 indicate that the more workload is applied to the load system 10, the lower the minimum energy point. It is expected because as the workload is increased, a ratio of the active energy for a leakage energy is increased at the same supply voltage. Points represented on the curve with a ring and a triangle are MEP measured by the tracking steps of 10 mV and 50 mV. As illustrated in FIG. 11, a minimum energy consumption of the multiplier measured in 10 mV step is reduced by up to 12% as compared with the minimum energy consumption of the multiplier measured only at 50 mV step. Accordingly, the proposed MET hardware which tracks the MEP at 10 mV step may find more accurate minimum energy operation voltage as compared with the conventional loop which tracks the MEP only at 50 mV step. MEPs measured at 10 mV of each multiplier mode were represented at 310 mV and 270 mV, respectively.

FIG. 12 shows that as the temperature increases from 0° C. to 100° C., the MEP increases in the 16×16 multiplier mode. This result is expected because the temperature increase induces the increase of the leakage energy.

In the meantime, according to the exemplary embodiment of the present disclosure, a minimum energy tracking (MET) loop apparatus which allows the load system 10 to consume a minimum energy for a given workload and temperature is provided. The minimum energy tracking loop apparatus 100 may more accurately track the minimum energy point using an accurate energy sensing method and a hierarchical tracking method, as compared with the conventional design. An experimental result of 130 nm CMOS process indicates that the proposed loop more accurately may find an actual minimum energy point than the existing loop and when the variable word length multiplier is used as the load system 10, approximately 12% or more energy may be saved. When the minimum energy tracking loop apparatus 100 according to the exemplary embodiment of the present disclosure is applied to a full-chip level design such as a micro-processor, it is expected that the energy may be much more saved.

In the meantime, a non-transitory computer readable storage medium is provided to store instructions which are executed by a processor to allow the processor to perform a method including: imitating a threshold path of a load system and automatically adjusting a clock frequency as a supply voltage to the load system is changed, supplying a power to the load system so as to maintain a constant output during each process of sensing an energy of the load system, calculating a proportional energy which is proportional to a total energy consumed by the load system at a specific supply voltage, finding a minimum energy point of the load system by monitoring the calculated proportional energy proportional to the total energy at a plurality of supply voltages, supplying a power to the load system with a supply voltage at which the load system operates with a minimum energy when the minimum energy point is found; and converting and providing the found minimum energy point into an analog reference voltage.

In the meantime, according to an exemplary embodiment of the present disclosure, various exemplary embodiments described above may be implemented by software including instructions stored in machine (for example, computer) readable storage media. The device is an apparatus which calls the stored instruction from the storage media and operates according to the called instruction and may include electronic device (for example, electronic device A) according to the disclosed exemplary embodiments. When the instruction is executed by a processor, the processor may perform the function corresponding to the instruction, directly or using other components under the control of the processor. The instruction may include a code which is generated or executed by a compiler or an interpreter. The machine readable storage media may be provided as non-transitory storage media. Here, "non-transitory" means that the storage media do not include signals, but are tangible, but do not distinguish that the data is semi-permanently or temporarily stored in the storage media.

Further, according to an exemplary embodiment of the present disclosure, the method according to various exemplary embodiments described above may be provided to be included in a computer program product. The computer program product may be traded between sellers and buyers as commodities. The computer program products may be distributed in the form of a machine readable storage media (for example, a compact disc read only memory (CD-ROM)) or online through an application store (for example, Playstore™). In the case of online distribution, at least some of computer program products may be temporarily stored in a storage memory such as a memory of a server of a manufacturer, a server of an application store, or a relay server or temporarily created.

Further, according to an exemplary embodiment of the present disclosure, various exemplary embodiments described above may be implemented in a computer or similar device readable recording media using software, hardware, or a combination thereof. In some cases, the exemplary embodiments described in the present specification may be implemented as a processor itself. According to the software implementation, exemplary embodiments such as the procedures and functions described in this specification may be implemented as separate software modules. Each of software modules may perform one or more functions and operations described in this specification.

In the meantime, computer instructions for performing the processing operation of the device according to the various embodiments described above may be stored in a non-transitory computer-readable medium. When the computer instructions stored in the non-transitory computer-readable medium, executed by the processor of the specific device, the computer instructions cause the specific device to perform the processing operation in the device according to the various embodiments described above. The non-transitory computer-readable medium, refers to a medium, that stores data semi-permanently and is readable by the device, rather than a medium that stores data for a short moment, such as registers, caches, and memories. Specific examples of the non-transitory computer-readable medium, may include a CD, DVD, hard disk, Blu-ray disk, USB, memory card, ROM, and the like.

In addition, each of the components (for example, a module or a program) according to the above-described various embodiments may be configured by a single or a plurality of entities, and some sub-components of the above described sub-components may be omitted, or other sub-components may be further included in various embodiments. Alternatively or additionally, some components (for example, modules or programs) may be integrated into a single entity to perform the same or similar functions performed by each corresponding component before being integrated. Operations performed by a module, a program, or other component, according to various embodiments, are executed sequentially, parallelly, iteratively, or heuristically, or at least some operations are executed in a different order, are omitted, or other operations may be added.

Preferred embodiments of the present disclosure have been illustrated and described above, but the present disclosure is not limited to the above-described specific embodiments, it is obvious that various modification may be made by those skilled in the art, to which the present disclosure pertains without departing from the gist of the present disclosure, which is claimed in the claims, and such modification should not be individually understood from the technical spirit or prospect of the present disclosure.

What is claimed is:

1. A minimum energy tracking loop apparatus connected to a load system, comprising:
    an oscillator configured to imitate a threshold path of the load system and automatically adjust a clock frequency as a supply voltage to the load system is changed;
    a voltage regulator configured to supply a power to the load system so as to maintain a constant output during each process of sensing an energy of the load system;
    an energy sensing unit which is connected to the oscillator and the voltage regulator and calculates a proportional energy proportional to a total energy consumed by the load system at a specific supply voltage;
    a minimum energy finder configured to find a minimum energy point of the load system by monitoring the calculated proportional energy proportional to the total energy at a plurality of supply voltages;
    a buck converter configured to supply a power to the load system with a supply voltage at which the load system operates with a minimum energy when the minimum energy point is found in the minimum energy finder; and
    a digital-analog converter which is connected to the voltage regulator and the buck converter and converts the found minimum energy point into an analog reference voltage to provide the converted energy point to the voltage regulator and the buck converter.

2. The minimum energy tracking loop apparatus according to claim 1, wherein the energy sensing unit includes:
    a ring oscillator which uses a bias current scaled from an output current of the voltage regulator to charge and discharge an internal node and is toggled according to an operation frequency proportional to the bias current during an energy sensing period;
    a frequency-digital converter which counts the number of toggles of the ring oscillator to convert the number of toggles into a digital value; and
    a multiplier which multiplies the converted digital value and a supply voltage which is supplied to the load system to calculate a proportional energy proportional to a total energy consumed by the load system.

3. The minimum energy tracking loop apparatus according to claim 2, wherein the operation frequency is proportional to an output current of the voltage regulator.

4. The minimum energy tracking loop apparatus according to claim 1, wherein the minimum energy finder finds a minimum energy point of the load system using a coarse tracking loop using a first step voltage and a fine tracking loop using a second step voltage which is lower than the first step voltage.

5. The minimum energy tracking loop apparatus according to claim 4, wherein the minimum energy finder performs the coarse tracking loop operation which calculates a first proportional energy using the initialized reference voltage and compares a second proportional energy calculated by increasing or decreasing the initialized reference voltage with the calculated first proportional energy.

6. The minimum energy tracking loop apparatus according to claim 5, wherein the minimum energy finder calculates the second proportional energy by increasing or decreasing the initialized reference voltage by a first step voltage.

7. The minimum energy tracking loop apparatus according to claim 5, wherein the minimum energy finder performs the coarse tracking loop operation to confirm whether the calculated second proportional energy exceeds the calculated first proportional energy.

8. The minimum energy tracking loop apparatus according to claim 4, wherein the minimum energy finder performs a fine tracking loop operation which compares a third proportional energy calculated by increasing or decreasing the calculated reference voltage with the calculated first proportional energy.

9. The minimum energy tracking loop apparatus according to claim 8, wherein the minimum energy finder calculates a third proportional energy by increasing or decreasing the calculated reference voltage by the second step voltage.

10. The minimum energy tracking loop apparatus according to claim 8, wherein the minimum energy finder performs the fine tracking loop operation to confirm whether the calculated third proportional energy exceeds the calculated first proportional energy.

11. A minimum energy tracking loop method performed by a minimum energy tracking loop apparatus connected to a load system, the method comprising:
    imitating a threshold path of the load system and automatically adjusting a clock frequency as a supply voltage to the load system is changed;
    supplying a power to the load system so as to maintain a constant output during each process of sensing an energy of the load system;
    calculating a proportional energy which is proportional to a total energy consumed by the load system at a specific supply voltage;
    finding a minimum energy point of the load system by monitoring the calculated proportional energy proportional to the total energy at a plurality of supply voltages;
    supplying a power to the load system with a supply voltage at which the load system operates with a minimum energy when the minimum energy point is found; and
    converting and providing the found minimum energy point into an analog reference voltage.

12. The minimum energy tracking loop method according to claim 11, wherein the calculating of a proportional energy includes:
- using a bias current scaled from a voltage regulated output current to charge and discharge an internal node and toggling according to an operation frequency proportional to the bias current during an energy sensing period;
- counting the number of toggles to convert the number of toggles into a digital value; and
- multiplying the converted digital value and a supply voltage which is supplied to the load system to calculate a proportional energy proportional to a total energy consumed by the load system.

13. The minimum energy tracking loop method according to claim 12, wherein the operation frequency is proportional to an output current.

14. The minimum energy tracking loop method according to claim 11, wherein in the finding of a minimum energy point, a minimum energy point of the load system is found using a coarse tracking loop using a first step voltage and a fine tracking loop using a second step voltage which is lower than the first step voltage.

15. The minimum energy tracking loop method according to claim 14, wherein in the finding of a minimum energy point, the coarse tracking loop operation which calculates a first proportional energy using the initialized reference voltage and compares a second proportional energy calculated by increasing or decreasing the initialized reference voltage with the calculated first proportional energy is performed.

16. The minimum energy tracking loop method according to claim 15, wherein in the finding of a minimum energy point, the second proportional energy is calculated by increasing or decreasing the initialized reference voltage by a first step voltage.

17. The minimum energy tracking loop method according to claim 15, wherein in the finding of a minimum energy point, the coarse tracking loop operation to confirm whether the calculated second proportional energy exceeds the calculated first proportional energy is performed.

18. The minimum energy tracking loop method according to claim 14, wherein in the finding of a minimum energy point, a fine tracking loop operation which compares a third proportional energy calculated by increasing or decreasing the calculated reference voltage with the calculated first proportional energy is performed.

19. The minimum energy tracking loop method according to claim 18, wherein in the finding of a minimum energy point, a third proportional energy is calculated by increasing or decreasing the calculated reference voltage by a second step voltage.

20. A non-transitory computer readable storage medium which stores instructions which are executed by a processor to allow the processor to perform the method comprising:
- imitating a threshold path of a load system and automatically adjusting a clock frequency as a supply voltage to the load system is changed;
- supplying a power to the load system so as to maintain a constant output during each process of sensing an energy of the load system;
- calculating a proportional energy which is proportional to a total energy consumed by the load system at a specific supply voltage;
- finding a minimum energy point of the load system by monitoring the calculated proportional energy proportional to the total energy at a plurality of supply voltages;
- supplying a power to the load system with a supply voltage at which the load system operates with a minimum energy when the minimum energy point is found; and
- converting and providing the found minimum energy point into an analog reference voltage.

* * * * *